United States Patent [19]

Altoz

[11] Patent Number: 4,915,167
[45] Date of Patent: Apr. 10, 1990

[54] THERMAL COUPLING TO ENHANCE HEAT TRANSFER

[75] Inventor: Frank E. Altoz, Catonsville, Md.

[73] Assignee: Westinghouse Electric Corp., Pittsburgh, Pa.

[21] Appl. No.: 228,409

[22] Filed: Aug. 5, 1988

[51] Int. Cl.[4] .............................................. F28F 7/00
[52] U.S. Cl. .................................... 165/185; 165/80.4; 361/386; 361/387
[58] Field of Search ............................ 165/80.4, 185; 361/386–388

[56] References Cited

U.S. PATENT DOCUMENTS

| | | | |
|---|---|---|---|
| 3,626,252 | 12/1971 | Cath | 361/387 |
| 3,965,973 | 6/1976 | Thettu et al. | 165/86 |
| 4,092,697 | 5/1978 | Spaight | 361/386 |
| 4,151,547 | 4/1979 | Rhoades et al. | 357/81 |
| 4,233,645 | 11/1980 | Balderes et al. | 361/80 |
| 4,384,610 | 5/1983 | Cook et al. | 165/80 |

OTHER PUBLICATIONS

Nuthes, R. W., "Semiconductor Chip With Liquid Metal Heat Transfer", IBM Tech. Discl. Bulletin, vol. 22, #4, Sep. 1979, p. 1553.
"A Novel Concept for Reducing Thermal Contact Resistance", AIAA-82-0866, Cook, Token & Calkins, Jun. 1982.
"Construction of a liquid Metal Filled Module", Arnold et al., IBM Technical Disclosure Bulletin, vol. 22, No. 2, Jul. 1979, pp. 602–605.
"An Experimental Investigation of Free-Convection Heat Transfer from Rectangular-Fin Arrays", Starner & McManus, Jr., Journal of Heat Transfer, Aug. 1963, Transactions of the ASME, pp. 273–278.

Primary Examiner—Martin P. Schwadron
Assistant Examiner—Allen J. Flanigan
Attorney, Agent, or Firm—W. G. Sutcliff

[57] ABSTRACT

The invention is a thermal coupling to promote heat transfer between a heat source and a heat sink with abutting surfaces using a deposition of a thermally conductive substance having a melting point temperature less than the temperature of the heat source such that the substance when heated will be in a liquid state capable of effectively transferring heat between the heat source and the heat sink. The deposition is situated between and contacts the abutting surfaces of the heat source and the heat sink. The substance is contained using a sealant to completely enclose the substance between the heat source and heat sink surface while an adhesive is used to secure the heat source to the heat sink.

13 Claims, 2 Drawing Sheets

THERMAL COUPLING TO ENHANCE HEAT TRANSFER

BACKGROUND OF THE INVENTION

The present invention relates to a device for promoting heat transfer between electrical components and a cooling plate wherein the electrical components and cooling plate are subjected to high levels of vibration or to multidirectional accelerations of a high magnitude, such as those vibrations or accelerations found in modern aircraft.

Heat transfer between two contacting surfaces occurs by conduction, convection and radiation. Of these three phenomena, the most effective is conduction. Conduction is the transmission of heat by the passage of energy from particle to particle in a material or between two mating materials. For maximum heat transfer by conduction between two surfaces it is therefore necessary to maximize the contact between the two surfaces. A variety of techniques have been used in the past for heat transfer by conduction across an interface between two surfaces. FIG. 1A shows a heat source 2 directly abutting a heat sink 4 with a dry interface between the heat source 2 and the heat sink 4. The direction of the flow of heat is indicated by arrows 6 and 8. Since conduction occurs only across those surfaces that are contacting, the heat transfer between two surfaces having no other interface material is entirely a function of the roughness and compatibility of the two dry surfaces. Air-filled interstitial voids exist where the mating surfaces of the heat source 2 and heat sink 4 do not directly contact and these voids do not effectively conduct heat. Typically, the thermal conductance across two dry surfaces is about 2.0 W/° C.-in$^2$ (watts per degree celsius per inch squared) when the pressure between engaging surfaces is 30 psi or greater.

When the configuration in FIG. 1A is subjected to severe vibration or high acceleration, there is essentially no change in the heat transfer rate between the heat source 2 and the heat sink 4 provided the pressure remains the same at 30 psi or more. However, totally independent of vibration or acceleration, the overall heat transfer of this configuration through conduction is poor.

FIG. 1B shows a heat source 2 next to a heat sink 4. However, in this figure, a layer 10 of aluminum silicate paste or alternatively of grease having a thickness of about 0.003 inches is situated between the heat source 2 and the heat sink 4 such that the interstitial spaces found in FIG. 1A are filled with grease and therefore heat transfer through conduction may occur across the entire surfaces of the heat source 2 and heat sink 4. In this case, the thermal conductance is approximately 5.6 W/° C.-in$^2$ and is independent of mating surface pressure.

When the configuration in FIG. 1B is subjected to high levels of vibration or acceleration, while the heat source 2 and the heat sink 4 may be held securely, the layer 10 of paste or grease eventually works its way from between the heat source 2 and heat sink 4 until the heat transfer of the configuration is reduced to a level comparable to that of the configuration shown in FIG. 1A.

FIG. 1C shows a heat source 2 and a heat sink 4 with a solid layer 12 of an elastomer material having a thickness of about 0.01 inches and contacting the surfaces of both of the heat source 2 and the heat sink 4. While this configuration is very resistant to high levels of vibration and acceleration, the thermal conductance is only about 4.4 W/° C.-in$^2$ at moderate pressures of 10 to 30 psi.

FIG. 1D shows an arrangement by which the heat source 2 and the heat sink 4 are both contacted by a common layer 14 of liquid metal having a thickness of about 0.01 inches. The thermal conductance through the layer of liquid between these two surfaces is about 52.6 W/° C.-in$^2$. Clearly this arrangement provides for a highly desirable heat transfer rate that is approximately ten times greater than that of any of the previous methods discussed. However, while such a heat transfer rate is highly desirable when compared with all of the techniques discussed, the configuration shown in FIG. 1D is also the most susceptible to high levels of acceleration or vibration since the layer 14 of liquid metal may freely escape from between the heat source 2 and the heat sink 4.

One object of this invention is to provide an improved heat transfer configuration between two mating surfaces having a heat transfer comparable to that of liquid between the surfaces.

Another object of this invention is to provide a thermal coupling to promote heat transfer that is capable of withstanding very high accelerations or severe vibration.

Another object of this invention is to provide a thermal coupling to promote heat transfer wherein the coupling is relatively simple to install and may be used in a mass production system.

U.S. Pat. No. 4,384,610 by Cook et al., entitled "Simple Thermal Joint", discloses a mechanically breakable thermal joint having a low melting point metallic material formed around a screen-like cellular structure. Heat transfer occurs between a heat source and a heat sink via the metallic material which melts and provides an intimate contact by filling any interstitial voids between the heat source and the heat sink surfaces. The screen-like cellular structure functions to promote retention of the molten metal between the two surfaces. However, this screen-like structure does not continue past the perimeter of the heat source and heat sink surfaces. When the configuration is subjected to high acceleration or vibration levels, molten metal escapes through the exposed edges of this configuration because the molten metal is not completely contained between the two surfaces.

SUMMARY OF THE INVENTION

The invention is a thermal coupling to promote heat transfer between a heat source and a heat sink with abutting surfaces using a deposition of a thermally conductive substance having a melting point temperature less than the temperature of the heat source such that the substance when heated will be in a liquid state capable of effectively transferring heat between the heat source and the heat sink. The deposition is situated between and contacts the abutting surfaces of the heat source and the heat sink. The substance is contained using a sealant to completely enclose the substance between the heat source and heat sink surface while an adhesive is used to secure the heat source to the heat sink.

DESCRIPTION OF THE PREFERRED EMBODIMENT

Figure 1A:
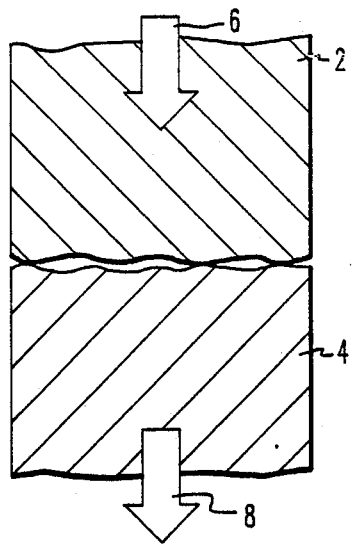
FIG. 1A–D shows sketches of prior art common interface configurations for heat transfer between the two surfaces through conduction.
Figure 1B:
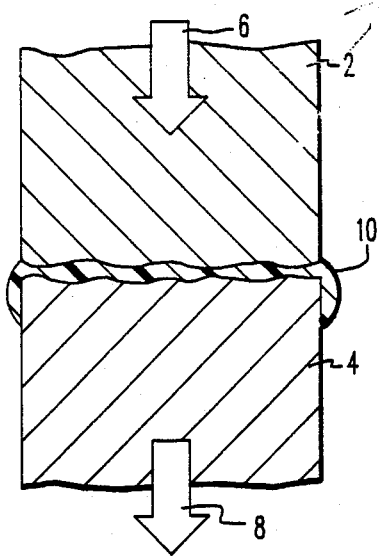
Figure 1C:
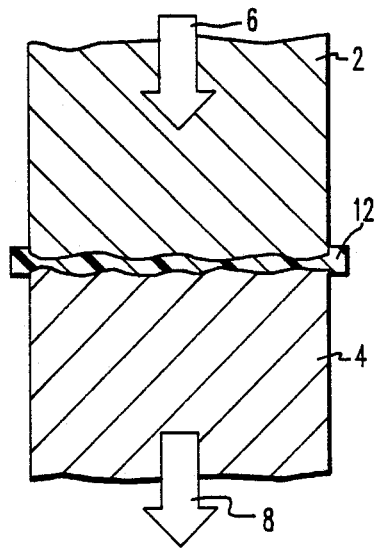
Figure 1D:
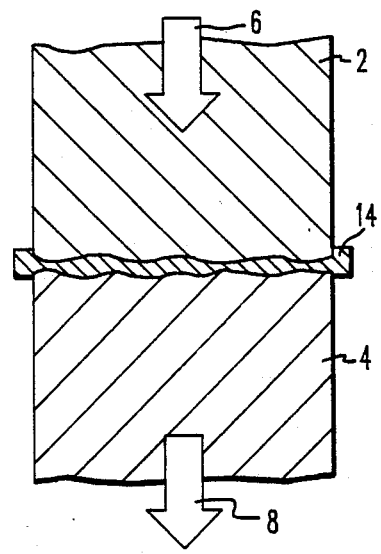
Figure 2:
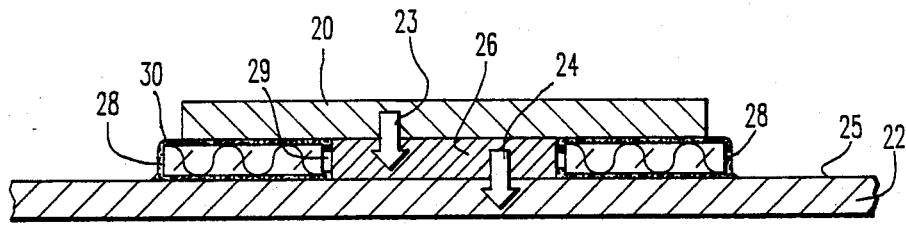
FIG. 2 shows a cross-sectional view of a preferred embodiment of the thermal coupling.
Figure 3:
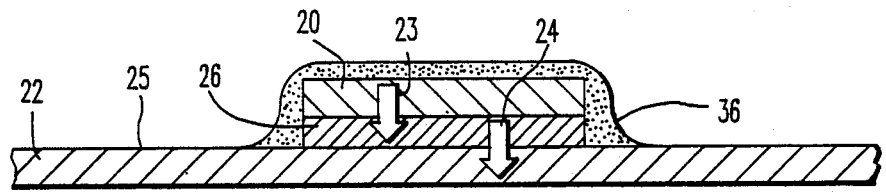
FIG. 3 shows a cross-sectional view of another embodiment of the thermal coupling.
Figure 4:
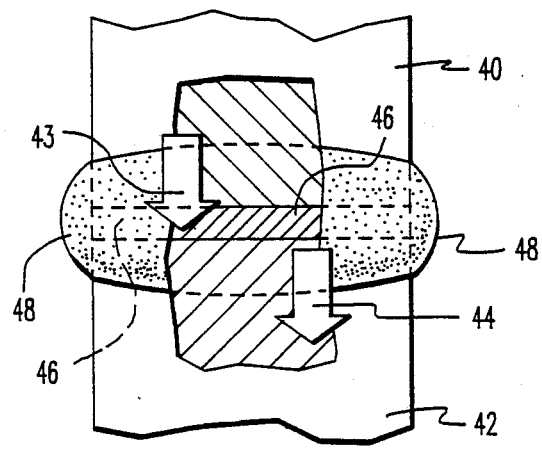
FIG. 4 shows a cross-sectional view of still another embodiment of the thermal coupling.

Referring now to FIGS. 2 through 4, the invention will be explained. The goal of this invention is to provide a more effective heat transfer path between a heat source 20 (FIG. 2) such as an electrical component and a heat sink 22 such as a cooling plate. Other heat sources compatible with this invention might be the traveling wave tubes on a phased array antenna or any power supply. The heat transfer occurs in a direction indicated by arrows 23 and 24. Beginning with a heat sink surface 25, a metal wafer 26 is placed on the surface 25 of the heat sink 22. Note that while throughout this discussion the configuration of a wafer will be used, the invention encompasses any deposition between the heat source and the heat sink mating surfaces that, as a liquid, fills the interstitial voids in the surfaces of the abutting heat source and heat sink. The thickness of the wafer 26 must be sufficient such that upon melting the interstitial voids between the heat source 20 and heat sink 22 are filled. This is a function of the roughness of the surfaces but typically a thickness in the magnitude of thousandths of inches is sufficient. The wafer 26 is made of a material such as a eutectic alloy which melts at a relatively low temperature. Specifically, the alloy must melt at a temperature less than that temperature of the heat source 20. Any number of eutectic alloys having relatively low melting points, such as eutectics using indium, bismuth or antimony could be selected for this purpose. One such alloy could be Indalloy 136, which is the trademark for a eutectic produced by the Indium Corporation of America having a composition of 21% indium, 49% bismuth, 18% lead and 12% tin. The melting point of Indalloy 136 is 136° F. (56° C.).

As an example, one typical heat source could be electronic components operating at a temperature of greater than 150° F. In this instance, the material of the alloy should have a melt range of between 100-150° F. Assume the selected eutectic alloy melts at 136° F. To contain the liquid, which is the melted alloy wafer 26, a seal is needed. To accomplish this, a preform 28, made of a fabric material and having a cavity 29 into which the wafer 26 may fit, is saturated with an adhesive compound. The fabric material of the preform 28 must be porous to absorb the adhesive and the fabric material must not be adversely affected by the temperature of the heat source 20. Furthermore, the fabric must not be adversely affected by the chemical adhesive. A possible fabric material could be cotton.

The heat source 20 is placed on the preform 28 which has been saturated with adhesive and sized such that a small projected edge 30 of the adhesive soaked preform 28 extends beyond the edge of the heat source 20. This small projected edge 30 is exposed to an ultraviolet light source to semi-harden the adhesive on the fabric 28. For this reason, the small projected edge 30 should protrude approximately 0.03 to 0.09 inches beyond the edge of the heat source 20. By curing the adhesive in the preform 28, the metal wafer 26 is effectively sealed between the heat source 20 and the heat sink 22 such that upon liquifying the wafer 26 is sufficiently contained.

A preferred adhesive with which to soak the preform 28 fabric would be comprised of urethane acrylate, which is an adhesive capable of being cured in a relatively short time using ultraviolet light. Urethane acrylic adhesives such as Gafgard 2330, 277AC, 280AC and 245, all trademarks of the GAF Corporation, are acceptable adhesives. When cured, these adhesives do not become rigid but become flexible, thereby promoting removal of the preform 20 if so desired. Furthermore, the flexibility of these adhesives may be influenced by using varying quantities of Luperox-118 which is a trademark used by the Lucidol Company for a general group of peroxide materials. In practice, replacement of a component having this interface arrangement is easily accomplished by using a sharp edge tool around the periphery of the preformed fabric 28.

Unlike earlier arrangements, the configuration in FIG. 2 when subjected to high acceleration or vibration levels still provides relatively high heat transfer values since the wafer 26, which has now become liquid, is adequately contained and not permitted to leak. As a comparison, the typical thermal conductance of a 0.010 inch thick wafer of a low melting point indium alloy is 53.0 W/° C.-in$^2$. This relatively high value is typical of eutectic metals that may be used as material for a wafer in the applications described herein.

Note that the configuration in FIG. 2 is conducive to a mass production arrangement where a number of uniformly sized heat sources 20 may be mounted and secured to a heat sink 22 in succession. Given a sized heat source 20, the metal wafer 26 and the preformed fabric 28 may be pre-sized. Upon soaking the preform 28 with adhesive, the preform 28 is placed against the heat sink surface 25. The metal wafer 26 is then placed in the cavity 29 of the preform 28. The heat source 20 is then placed on the adhesive soaked preform 28 such that narrow edges 30 are not covered. Upon exposure to ultraviolet light, the adhesive cures and secures the heat source 20 to the preform 28 and the preform 28 to the heat sink 22. Mass production of this configuration is permitted by the simplified design shown in FIG. 2.

Another embodiment of the invention is illustrated in FIG. 3. In this embodiment, on the surface 24 of a heat sink 22, a metal wafer 26 comprised of a material such as a low melting point alloy similar to that mentioned above, is placed on the heat sink surface 25. A heat source 20 is placed above the wafer 26. A coating 36 of adhesive is then applied over both the heat source 20 and the alloy wafer 26. The coating 36 also contacts the heat sink surface 25. The adhesive may be comprised of the same materials as those mentioned previously. This configuration is then, just as before, subjected to ultraviolet light to cure the adhesive which semihardens the coating 36. The metal wafer 26 is completely enclosed by the adhesive coating 36 such that upon liquifying from the temperature of the heat source 20, the liquid is entirely contained by the configuration and therefore the heat transfer between the heat source and the heat sink through the liquid may be maintained regardless of the presence of high acceleration or vibration levels. Note that just as in the prior example, this configuration too is conducive to an arrangement favorable to mass production.

FIG. 4 shows still another embodiment. In this embodiment, the heat source 40 and the heat sink 42 are again separated by a metal wafer 46 of a material comprising a low melting point alloy such as that discussed above. The heat transfer occurs in a direction indicated by arrows 43 and 44. In this embodiment, however, the heat source 40 and heat sink 42 which may be in the shape of longitudinal members, are positioned abutting the metal wafer 46. An adhesive covering 48 encloses an area around the metal wafer 46 and completely encompasses the metal wafer 46 between the heat source 40 and the heat sink 42. Just as in previously discussed embodiments, the adhesive covering 48 is exposed to ultraviolet light such that the adhesive cures to a semi-hardened consistency. Subsequently, when the configuration is in use, the temperature of the heat source 40 exceeds the melting point of the metal wafer 46 and the shim becomes liquid metal, thereby promoting heat transfer between the heat source 40 and the heat sink 42. Again, this arrangement provides improved heat transfer regardless of the presence of high acceleration or vibration levels.

Note that in each of these embodiments, the selected adhesive requires exposure to ultraviolet light in order for the adhesive to be cured. While this is a desirable feature, it comprises only one of a number of possible types of adhesives. Furthermore flexibility of the ultraviolet cured adhesive or any adhesive is only a convenience and subsequently any adhesive that would act as a sealant to the molten metal under the operating conditions of a given application would be an entirely acceptable substitute adhesive for that ultraviolet cured adhesive described above.

Furthermore, note that in each of these embodiments, a wafer made of a low melting point alloy was used. While this is desirable, any material that would flow to fill the interstitial voids between the mating surfaces would be adequate. As examples, grease or even water could be used to fill the cavity in FIGS. 2 and 3. The gap between the mating surfaces in FIG. 4 could be filled with any viscous liquid that would resist flowing at ambient temperatures when the configuration is assembled.

Finally note that in FIGS. 2 and 3 the heat source 20 indirectly rests upon the heat sink 22. The heat source could be interchanged with the heat sink such that the heat sink is indicated by item 20 and the heat source is indicated by item 22. The effectiveness of the heat transfer would not be changed.

Although this invention has been described with reference to a specific embodiment thereof, numerous modifications are possible without departing from the invention, and it is desirable to cover all modifications falling within the spirit and scope of this invention.

What is claimed is:

1. A thermal coupling to promote heat transfer between a heat source and a heat sink with facing surfaces comprising:
   (a) a deposition of a thermally conductive substance having a melting point temperature less than the temperature of the heat source such that the substance when heated will be in a liquid state capable of effectively transferring heat between the heat source and the heat sink, the deposition being situated between and contacting the facing surfaces of the heat source and the heat sink; and
   (b) a sealant and adhesive means enveloping the heat source and the deposition and bonded to the heat sink such that the deposition and the heat source are sealed and are secured to the heat sink.

2. The thermal coupling according to claim 1, wherein the deposition has a top side, a bottom side and an outer edge and the deposition is placed between the heat source and the heat sink with the top side in contact with the heat source and the bottom side in contact with the heat sink.

3. The thermal coupling according to claim 1, wherein the thermally conductive substance is comprised of a low melting point eutectic alloy.

4. The thermal coupling according to claim 3, wherein the eutectic alloy is an alloy of a material selected from a group comprising indium, antimony and bismuth.

5. The thermal coupling according to claim 1, wherein the sealant and adhesive means is a chemical adhesive compound.

6. The thermal coupling according to claim 5 wherein the chemical adhesive compound is comprised of an ultraviolet heat-curable urethane acrylate.

7. The thermal coupling according to claim 6, wherein the adhesive compound further comprises quantities of Luperox-118, a trademark by the Lucidol Company representing a peroxide additive used to control flexibility of the chemical adhesive compound.

8. A thermal coupling to promote heat transfer between a heat source and a heat sink with facing surfaces comprising:
   (a) a deposition of a eutectic alloy having a melting point less than the temperature of the heat source such that the alloy when heated will be in a liquid state capable of effectively transferring heat between the heat source and the heat sink, the deposition having a top side, a bottom side and an outer edge and being placed between the heat source and the heat sink with the top side being in contact with the heat source and the bottom side being in contact with the heat sink; and
   (b) a sealant and adhesive means comprised of a preform positioned and compressed between the heat source and the heat sink, the preform being made of a layer of fabric material saturated with an ultraviolet heat-curable urethane acrylate and the preform having a cutout forming a cavity in which the eutectic alloy deposition is located.

9. A thermal coupling to promote heat transfer between a heat source and a heat sink with facing surfaces comprising:
   (a) a deposition of a thermally conductive substance having a melting point temperature less than the temperature of the heat source such that the substance when heated will be in a liquid state capable of effectively transferring heat between the heat source and the heat sink, the deposition situated between and contacting the facing surfaces of the heat source and the heat sink; and
   (b) a sealant and adhesive means around the deposition of the conductive substance sealing the deposition between the heat source and the heat sink and securing the heat sink to the heat source, wherein the sealant and adhesive means is a preform positioned and compressed between the heat source and the heat sink, the preform being made of a layer of fabric material saturated with a chemical adhesive compound and the preform having a cutout forming a cavity in which the thermally conductive substance is located.

10. The thermal coupling according to claim 9, wherein the chemical adhesive compound is comprised of an ultraviolet heat-curable urethane acrylate.

11. The thermal coupling according to claim 10, wherein the adhesive compound further comprises quantities of Luperox-118, a trademark by the Lucidol Company representing a peroxide additive used to control flexibility of the chemical adhesive compound.

12. The thermal coupling according to claim 9, wherein the thermally conductive substance is comprised of a low melting point eutectic alloy.

13. The thermal coupling according to claim 10, wherein the eutectic alloy is an alloy of a material selected from a group comprising indium, antimony and bismuth.

* * * * *